United States Patent [19]

Nakaie et al.

[11] Patent Number: 4,677,375
[45] Date of Patent: Jun. 30, 1987

[54] APPARATUS FOR TESTING INTEGRATED CIRCUIT

[75] Inventors: Toshiyuki Nakaie; Akira Yoshino, both of Wakayama, Japan

[73] Assignee: Hanwa Electronic Co., Ltd., Wakayama, Japan

[21] Appl. No.: 745,265

[22] Filed: Jun. 14, 1985

[51] Int. Cl.$^4$ .................... G01R 31/26; G01R 1/04
[52] U.S. Cl. ........................... 324/158 F; 200/13; 200/155 R
[58] Field of Search .............. 200/4, 11 R, 155 R, 200/11 D, 292, 11 DA, 13; 324/158 F, 66

[56] References Cited

U.S. PATENT DOCUMENTS

| 2,668,261 | 2/1954 | Hooker et al. | 200/13 |
| 3,161,847 | 12/1964 | Matsunaga | 200/155 |
| 3,264,419 | 8/1966 | Handel et al. | 200/11 D |
| 3,534,184 | 10/1970 | Tabet | 200/11 R |
| 4,356,360 | 10/1982 | Volz | 200/11 R |

FOREIGN PATENT DOCUMENTS 2639688  3/1978  Fed. Rep. of Germany ........ 324/66

Primary Examiner—Reinhard J. Eisenzopf
Assistant Examiner—Stephen M. Baker
Attorney, Agent, or Firm—Burgess, Ryan & Wayne

[57] ABSTRACT

An apparatus for testing plug-in type integrated circuits by applying a potential across their input and output terminals, utilizing a socket board with a plurality of sockets bored therein to receive respective input and output terminals of an integrated circuit. A pair of first and second groups of fixed contacts are located in the socket board, arranged in two concentric circles enclosing the sockets. Each fixed contact in each group is individually connected to one of the sockets through a conductor. A pair of coaxial first and second moving contact pins is rotatably disposed below the socket board. The first contact pin rotates to follow the first circle while sequentially contacting the contacts of the first group. The second contact pin follows the second circle, making sequential contact with the fixed contacts of the second group. It is so arranged that, when both contact pins are brought into contact with a selected pair of contacts from the two groups, one contact pin connects an input terminal while the other contact pin connects an output terminal, or vice versa, of the integrated circuit mounted on the socket board. In doing so, the contact pins pass current across the output and input terminals for a test.

6 Claims, 7 Drawing Figures

APPARATUS FOR TESTING INTEGRATED CIRCUIT

FIELD OF THE INVENTION

The present invention relates generally to an improved apparatus for testing integrated circuits by applying test voltage across pairs of input and output terminals thereof and, in particular, to such an apparatus having a means by which the terminal pairs are automatically changed over.

BACKGROUND OF THE INVENTION

As the complexity of integrated circuits has increased, the difficulty of determining whether a particular circuit is functional has increased considerably. In a well-known test method for integrated circuits, a charging circuit having a capacitor, after it has been charged, is discharged through pairs of input and output terminals of an integrated circuit to be tested, one pair at a time, to apply a test voltage so as to check for an abnormality or any change in the diode characteristic of each pair. In this type of check, both before and after each capacitor discharge the same magnitude of current is passed through the terminal pair and the potential across the terminals is read to see whether the readings differ before and after the test voltage is discharged by the capacitor.

This test method requires consecutive changeover of terminal pairs so that the checks on individual pairs can be proceeded with in a continuous manner. Manual changeover is not only inefficient but also demands considerable time.

One way of automatic changeover is the use of a changeover device with a relay circuit. However, this type of device is disadvantageous in that it requires a number of long wires equal to the number of input and output terminals in an integrated circuit to be tested. In addition, undesirable barrier capacitance occurring between a lead wire and ground increases in proportion to the length of the lead wire.

Consequently, the presence of this barrier capacitance can result in an error in measuring the potential discharged from the test capacitor.

SUMMARY OF THE INVENTION

A primary object of the present invention is to provide an apparatus for testing integrated circuits by applying test voltage between the pairs of integrated circuit input and output terminals which has a means by which the terminal pairs are changed over consecutively in an automatic manner.

Another object is to provide such an apparatus which has a means capable of accurately measuring the test potential discharged from a test capacitor.

The foregoing and other objects of this invention are achieved by an improved testing apparatus having a changeover means comprising a socket board provided with sockets for receiving therein the input and output terminals of a plug-in type integrated circuit to be tested. Enclosing the sockets are circular rows of concentrically arranged fixed contacts, which are so arranged that each of the sockets is connected individually to a different fixed contact from each row. Below the socket board are rotatably disposed a pair of movable contact pins which are rotated in positions and brought into selective contact with the fixed contacts in the rows connected to the corresponding pair of input and output terminals of the circuit through the associated sockets. The test voltage is passed through the movable contact pins across the integrated circuit terminal pairs thus connected to them.

BRIEF EXPLANATION OF THE ACCOMPANYING DRAWINGS

FIG. 4($b$) is a cross-section view taken along the line 4—4 of FIG. 4($a$);

FIG. 5($b$) is a cross-section view of the contact pin and part of the wiring of the embodiment shown in FIG. 5($a$).

DETAILED DESCRIPTION OF THE PREFERRED EMBODIMENTS

Before describing the changeover system of the present invention, the method by which the integrated circuit is tested will be briefly described so that the advantages of the invention will be more readily understood.

Figure 1:
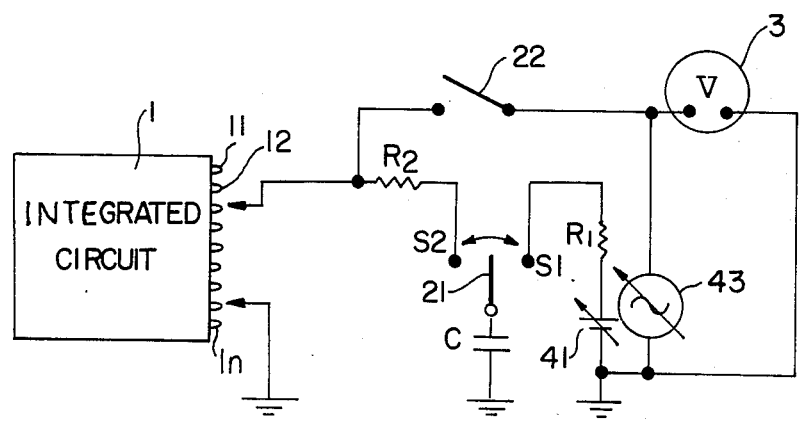
FIG. 1 is the circuit of the testing system of the present invention comprising a first charging circuit for charging and discharging a capacitor through the selected pairs of input and output terminals of an integrated circuit to be tested and a second circuit for measuring changes in diode characteristic.

FIG. 1 shows: a a first circuit for charging and discharging capacitor C through the pairs of input and output terminals of an integrated circuit 1 to be tested, one terminal pair at a time, and a second circuit for measuring the diode characteristic of each of the terminal pairs.

The capacitor C is first charged by closing a switch 21 with a fixed contact $S_1$ that is connected to a d.c. source of variable potential 41 which can charge the capacitor C to a variable voltage, as will be described later.

While the capacitor C is charged, a switch 22 is closed to allow current from an a.c. source of variable current 43 to flow to the integrated circuit 1 through its currently selected terminal pair. At this point, a voltmeter 3, provided between the switch 22 and the power source 43, is read and the measured potential across the integrated circuit terminals is noted as a value indicative of the diode characteristic before discharging the capacitor C.

Then the switch 22 is opened and the switch 21 is swung away from the contact $s_1$ and is closed with the contact $s_2$ that is connected to the integrated circuit 1. This discharges the capacitor C through the terminal pair of the integrated circuit 1. At this point, the potential discharged from the capacitor is read on the voltmeter 3 and recorded.

Again, the switch 22 is closed to supply the same terminal pair with the same magnitude of current from the source 43 and the voltmeter 3 is read to see whether the read voltage differs before and after the discharge of the capacitor C.

When there is no significant voltage change detected, the capacitor C is charged to a greater magnitude of potential and then discharged through the same terminal pair. Of cource, before and after this second discharge, the switch 22 is closed to apply source current to the terminal pair. Readings are compared to check for a change in diode characteristic. In this way, the capacitor C is discharged to apply an increasing potential to the same terminal pair until it causes damage.

After the test of the first terminal pair is completed, a second pair is selected and the same test procedure is repeated.

After the second terminal pair, a third pair is tested and so on, until all the input and output pairs are tested.

Figure 2:
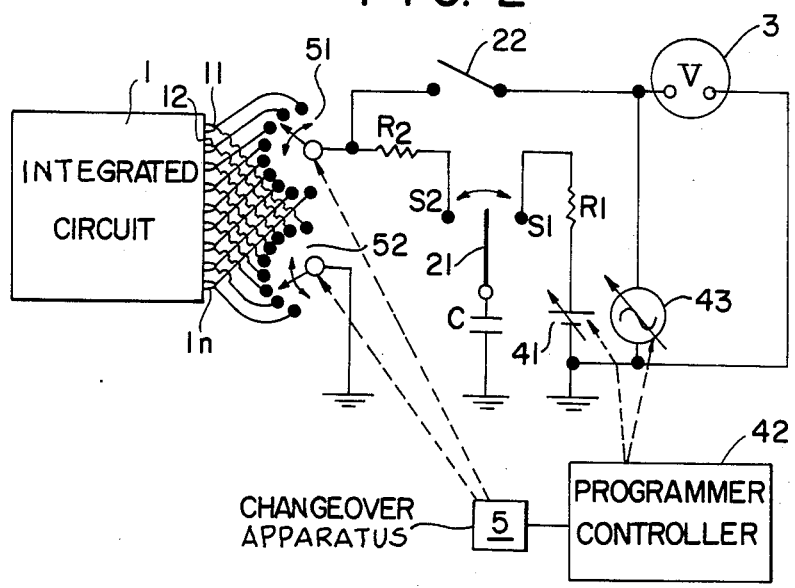
FIG. 2 is the changeover system according to this invention for selecting the integrated circuit terminal pairs, one at a time, in a consecutive manner under the control of an electronic programmer controller.

FIG. 2 contains a measuring circuit similar to the one shown in FIG. 1 and an automatic changeover system in which the terminal pairs of an integrated circuit 1 are consecutively changed over in an automatic manner. In this embodiment, measurement of the diode characteristic and selection of terminal pairs are both controlled by a programmer controller 42, which are connected to the changeover system and both sources 41 and 43 of test direct current and alternating current.

Referring to FIG. 2, the changeover system comprises a first selector 51 and a second selector 52 which are driven into positions and contacted with the selected input and output terminals of an integrated circuit to be tested in a consecutive manner under the direction of the programmer controller 42.

The controller 42 also controls both sources 41 and 43 in such a manner that the magnitude of current applied across the selected terminal pair before and after discharging the capacitor C, is rated at a predetermined level proportional to the potential discharged from the capacitor C through the terminal pair.

Figure 3:
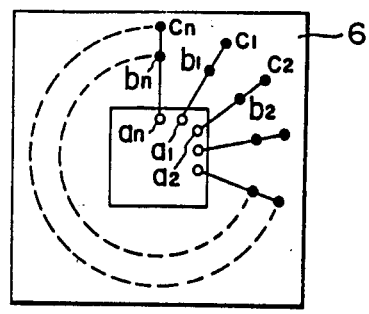
FIG. 3 is a plan view of one embodiment of the socket board according to this invention.

FIG. 3 shows the arrangement of the socket board 6 constructed in accordance with one embodiment of the present invention.

As shown in FIG. 3, the socket board 6 has a plurality of sockets bored therein which receive individually the input and output terminals of an integrated circuit to be tested. The number of these sockets $a_1, a_2, \ldots, a_n$ may preferably related to the terminals. Thus, the sockets are divided into a first group $a_1$ through $a_i$ for the input terminals and a second group $a_j$ through $a_n$ for the output terminals.

Enclosing the sockets $a_1$ through $a_n$ are arranged in the socket board 6 a pair of concentric circles of fixed contacts $b_1, b_2, \ldots, b_n$ and $c_1, c_2, \ldots, c_n$.

Also, it is so arranged that (i) socket $a_1$ is connected through a conductor to fixed contacts $b_1$ and $c_1$, (ii) socket $a_2$ is connected through a conductor to contacts $b_2$ and $c_2$, and (iii) so on until each socket $a_i$ is connected to corresponding fixed contracts $b_i$ and $c_i$.

Consequently, when an integrated circuit 1 is placed on the socket board 6 with its input and output terminals properly inserted into the sockets $a_1$ through $a_n$, the fixed contacts $b_1$ through $b_i$ and $c_1$ through $c_i$ are individually connected to the input terminals while the contacts $b_j$ to $b_n$ and $c_j$ to $c_n$ are respectively connected to the output terminals of the integrated circuit.

Figure 4A:
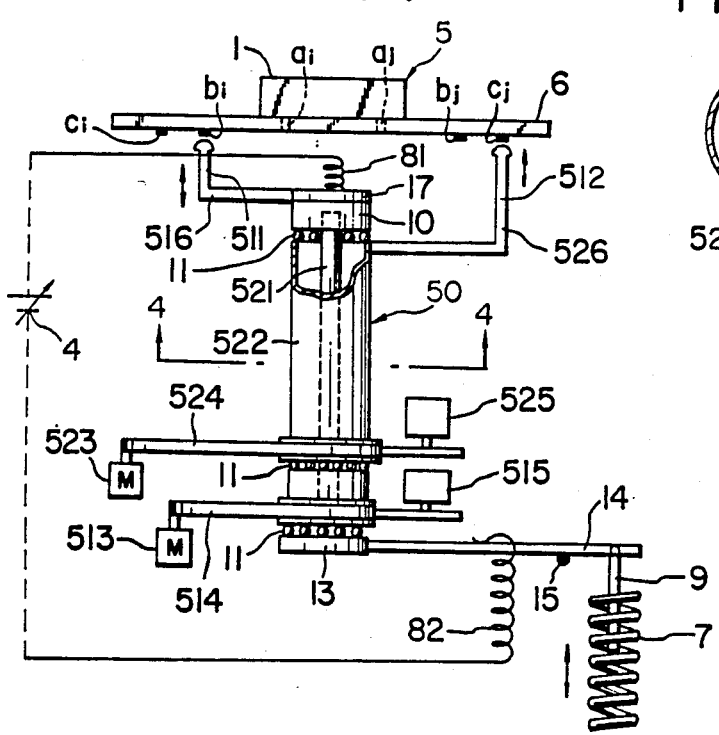
FIG. 4($a$) is a vertical cross-section view of the testing apparatus of this invention.

FIG. 4(a) shows the construction of the changeover apparatus 5 according to one embodiment of the invention.

The apparatus 5 has a central post 50 composed of an inner shaft 521 and an outer shaft 522 concentrically mounted outside the inner shaft 521.

The shafts 521 and 522 are rotatably disposed and each shaft is provided at its top with a pair of moving contact pins 511 and 512 through horizontal arms 516 and 526. It is so arranged that, when the inner and outer shafts 521 and 522 are rotated about the axis, the contact pins 511 and 512 are turned just below the socket board 6 following the inner and outer circles connecting the fixed contacts $b_1$ to $b_n$ and $c_1$ to $c_n$, respectively. In operation, the contact pin 511 is stituated below any of the fixed contacts $b_1$ through $b_i$, the other contact pin 512 is below one of the contacts $c_j$ through $c_n$, and vice versa. In other words, the moving contacts pins 511 and 512 are always disposed for connection to a single selected pair of integrated circuit input and output terminals to be tested.

The post 50 is mounted on a stand 13 and the shafts 521 and 522 are respectively rotated by motors 513 and 523 through drive belts 514 and 524.

The post 50 is movably disposed for vertical movement between a lower and upper positions. A lever 14 is affixed at one end to the stand 13 and at the other end to a magnet 9 that is inserted into a solenoid 7.

The lever 14 is supported on a fulcrum 15 to tilt in a seesaw-like manner. When the solenoid 7, which is connected to a current source (not shown), is energized, the magnet 9 moves downward, tilting the lever 14 and thereby raising the post 50 from the original lower position to the upper position.

A first conductive line 81 is provided which has one end connected to a d.c. source 4. The other end of the line 81 is formed into a spring and situated above the top of the post 50 at such a point that, when the post 50 is raised into the higher position, the line 81 brings its spring end to come to come into contact with the post 50.

Also, a second conductive line 82 is provided which is connected at one end to the d.c. source 4. The opposite end is formed into a spring that is located adjacent the lever 14 at such a point that, when the lever 14 is moved by the magnet 9 moving downward, the line 82 causes its spring end to contact the lever 14. The lever 14 has a conductor (not shown) connected between it and the moving contact pin 512 through the outer shaft 522.

The outer shaft 522 is electrically insulated with respect to the inner shaft 512.

Also, the top 17 of the post 50 has a conductor (not shown) connected between it and the moving contact pin 511. The numeral 11 designates ball bearings provided for smooth rotation of both shafts 521 and 522.

Provision may preferably be made to detect the rotational angle of both shafts 521 and 522 so that it is possible to check the determine if the contact pins 511 and 512 are properly in contact with the selected fixed contacts b and c.

In the embodiment of FIG. 4(a), this is done by a pair of potentiometers 515 and 525 that are operatively connected to the shafts 521 and 522.

With this arrangement, when the shafts 521 and 522 are rotated to bring their respective movable contact pins 511 and 512 into positions below the selected pair of fixed contacts, for example, $b_i$ and $c_j$ that are respectively connected to the input and output terminals inserted in the sockets $a_i$ and $a_j$, the solenoid 7 is energized causing the post 50 to move into its upper position. Current from the d.c. source 4 flows through the first line 81, the top 17 of the post, the contact pin 511 and the fixed contact $b_i$ to the contact $c_j$, then to the second line 82 through the moving contact pint 512 and the lever 14.

In this way, the current is applied across the selected terminal pair of the integrated circuit 1 to determine the diode characteristic thereof.

Preferably, the springs at the lines 81 and 82 are sufficiently elastic so that, when the post 50 is in its upper position holding the contact pins 511 and 512 against the selected fixed contacts, the spring action serves to support the shafts 521 and 522 in stable position.

Then, after the voltmeter 3 is read, the solenoid 7 is de-energized. The post 50 moves down on its own weight, breaking the circuit between the fixed contacts $b_i$ and $c_j$, since the post 50 is moved out of contact with the spring of the line 81.

In one preferred embodiment, the spring of the line 82 may preferably be designed to engage with the lever 14 in such a manner that the spring urges the lever 14 downward, when the post 50 is in its upper position, so that it can adjust the pressure with which the contact pins 511 and 512 are pressed against the contacts by urging the post 50 downward.

Figure 4B:
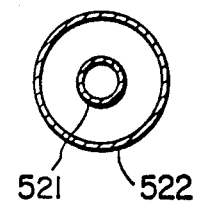

FIG. 4(b) is a cross-section view taken along the line 4—4 of FIG. 4(a) showing that the outer shaft 522 is radially spaced from the inner shaft 521. Moreover, as shown in FIG. 4(a), an insulator 10 is interposed between the arms 516 and 526 to prevent any short circuit between the contact pins 511 and 512, when the post 50 is in the upper position.

For the test along with the measurements of diode characteristic on this terminal pair of the integrated circuit 1, the shafts 521 and 522 are rotated by the motors 513 and 523 to bring their respective contact pins 511 and 512 into positions below a second selected pair of fixed contacts, for example, $b_i$ and $c_j$. Thereafter, the foregoing steps are repeated.

Figure 5A:
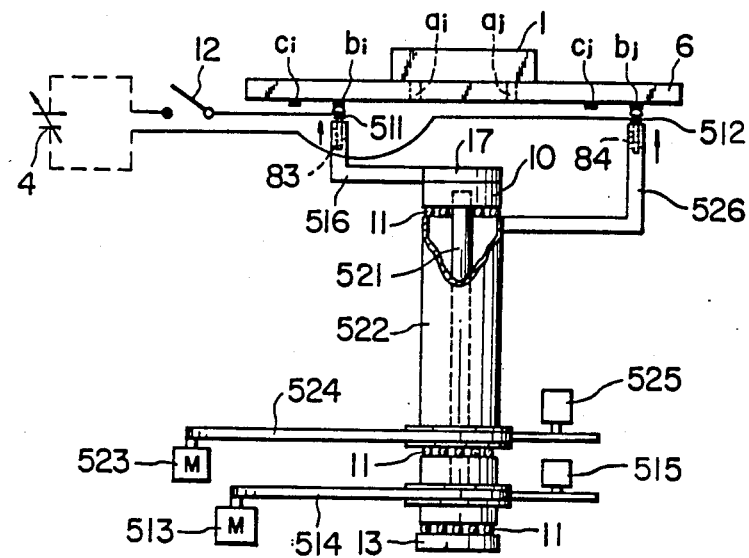
FIG. 5($a$) is a vertical cross-section view of another embodiment of the present invention.

FIG. 5(a) shows another preferred embodiment of the changeover system according to the present invention which is similar to the embodiment of 4(a) except for a few points that now will be described.

Figure 5B:
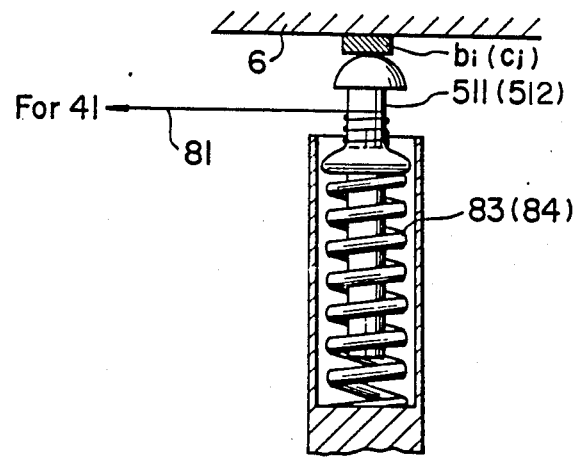

As shown in FIG. 5(b), which is a cross-section view of the contact pin 511 of the embodiment of FIG. 5(a), the moving contact pin is urged in the upward direction by a spring 83 fitted about the lower part of the pin 511.

When the shaft 521 is rotated, the contact pin 511 moves in constant contact with the circle along which the fixed contacts $b_i$ to $b_n$ are disposed. The other contact pin 512 also has a spring 84 and is designed to operate in the same manner as the contact pin 511, except that it is in constant contact with the circle of the fixed contacts $c_1$ through $c_n$.

A first line 81 is connected at one end to the contact pin 511 and at its other end to a source of current 4. Also, a second line 82 has one end connected to the contact pin 512. The other end of the line 82 is connected to the source 4. A switch 12 is provided in the line 82 to open or close the circuit to the contact pins 512 and 511.

The mechanism to drive the concentric shafts 521 and 522 is substantially similar to the embodiment of FIG. 4(a).

Current through the selected pair of input and output terminals of an integrated circuit 1 placed on the socket board 6, is switched on and off by closing and opening the switch 12.

In the present invention, the lead wires connected between the contact pins and a potential source for measurement of diode characteristic can be made shorter than those of the conventional measuring systems with relay circuits, so that the effect of barrier capacitance that can occur between lead wires and ground is reduced. Consequently, errors in the measurement of diode characteristic can be greatly reduced.

It is to be understood that the invention is not limited to the precise construction shown or the description given above, but that changes contemplated as readily falling within the spirit of the invention shall also be covered by the scope of this invention as determined by the appended claims.

What is claimed is:

1. An apparatus for testing plug-in type integrated circuits by applying a potential to input and output terminals thereof, comprising a socket board having a plurality of sockets bored therein for receiving the input and output terminals of an integrated circuit to be tested that is placed on said socket board, a first group of fixed contacts planted in said board and arranged in a circle enclosing said sockets, said fixed contacts being individually connected with said sockets through a conductor, a second group of fixed contacts also planted in said socket board and arranged in a large circle concentrically enclosing said first group of fixed contacts, said second group of fixed contacts being individually connected through a conductor to said sockets, and a pair of first and second contact pins rotatably disposed below said socket board for rotation about the same axis, said first contact pin being rotated to follow said circle of said first group of fixed contacts and, in doing so, make selective contact therewith, said second contact pin being rotated to follow said circle of said second group of fixed contacts and, in doing so, make selective contact therewith, said first and second contact pins being connected with opposite poles of a potential source, said first and second contact pins being respectively mounted on a pair of shafts concentrically rotatably disposed for rotation about the same axis.

2. An apparatus as set forth in claim 1, wherein an electric line connects each of said first and second contact pins and said source and is formed at one end thereof into a coil wherein an electric circuit through said source and fixed contacts in contact with said first and second contact pins is closed when said coiled end is contacted with a corresponding contact pin.

3. An apparatus as set forth in claim 2, wherein each of said concentric shafts is movably disposed for vertical movement between a first position where said contact pins are moved into contact with the selected pair of said first group and second group of fixed contacts and a second position where said contact pins are moved away from said socket board.

4. An apparatus as set forth in claim 3, wherein said concentric shafts are connected to a solenoid with a magnet bar inserted into said solenoid and secured at the opposite end to said concentric shafts such that energization and deenergization of said solenoid causes said concentric shafts to move vertically through said magnet bar.

5. An apparatus as set forth in claim 1, each of said contact pins has a spring that is wound about a lower part thereof and which urges the contact pin toward the socket board so that, when said shafts are rotated, said contact pins move in constant contact with said socket board.

6. An apparatus as set forth in claim 1, wherein the rotative movement of said shafts is detected by a potentiometer.

* * * * *